(12) United States Patent
Ikeda et al.

(10) Patent No.: US 6,317,353 B1
(45) Date of Patent: Nov. 13, 2001

(54) SEMICONDUCTOR INTEGRATED CIRCUIT (75) Inventors: Toshimi Ikeda; Masato Matsumiya; Masato Takita, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/536,449

(22) Filed: Mar. 28, 2000

(30) Foreign Application Priority Data

May 11, 1999 (JP) .................................................. 11-129558

(51) Int. Cl.$^7$ ....................................................... G11C 5/06
(52) U.S. Cl. .................................. 365/63; 365/51; 365/226
(58) Field of Search ................................. 365/63, 51, 226

(56) References Cited

U.S. PATENT DOCUMENTS

| | | | |
|---|---|---|---|
| 5,117,277 | * 5/1992 | Yuyama et al. | 357/71 |
| 5,293,559 | 3/1994 | Kim et al. | 365/63 |
| 5,991,224 | * 11/1999 | Aipperspach et al. | 365/230.05 |
| 6,115,310 | * 9/2000 | Netis et al. | 327/293 |

FOREIGN PATENT DOCUMENTS 10-150169    6/1998  (JP) .

\* cited by examiner

*Primary Examiner*—Amir Zarabian
*Assistant Examiner*—Tuan T. Nguyen
(74) *Attorney, Agent, or Firm*—Arent Fox Plotkin & Kahn PLLC (57) ABSTRACT

A power supply line is formed over a memory cell array which has arranged a plurality of memory cells using a metal wiring layer M1 which is disposed on the side closest to the memory cell array, of all the metal wiring layers. The power supply lines are formed over the memory cell array using not only an upper metal wiring layer M2 but the metal wiring layer M1 so that the wiring resistance of the power supply lines may decrease and a sufficient amount of current can be supplied to the power supply lines. Consequently, the circuits supplied with an electric current through the power supply lines become capable of high-speed operation. This is particularly effective for the high-speed operation of the circuits arranged around the memory cell array. The power supply line formed using the lower metal wiring layer M1 is connected over the memory cell array to a power supply line which is formed using the metal wiring layer M2 on the upper layer than the metal wiring layer M1. Therefore, the netlike configuration of the power supply lines can be made with higher density compared to conventional ones.

7 Claims, 5 Drawing Sheets fig.1 fig.2 fig.3 fig.4 fig.5

SEMICONDUCTOR INTEGRATED CIRCUIT

BACKGROUND OF THE INVENTION

1. Field of the Invention

The present invention relates to a semiconductor integrated circuit, and particularly to a semiconductor integrated circuit which comprises a memory cell array having arranged a plurality of memory cells.

2. Description of the Related Art

Elements that constitute a semiconductor integrated circuit have become finer with the development of semiconductor manufacturing technologies. Finer elements allow semiconductor integrated circuits to reach higher integration at an equal chip size or to reduce the chip size at an equal integration level. For example, in the case of semiconductor memories, finer elements have helped to develop products of greater memory capacity, or of reduced chip size with an equal memory capacity.

Recently, there has been a growing demand for higher performance as well as larger capacity in semiconductor memories such as a dynamic random access memory (DRAM). On this account, for example, when elements are made finer for reduction of chip size, it accompanies speeding up of the operation of predetermined circuits and improvements in access time.

In designing a high-speed circuit, an increase is needed in the amount of electric current to be supplied to the circuit. In order to reduce voltage drops and keep the current density within specifications, the increase in the amount of current in turn requires that power supply lines connected to the circuit be greater in width to reduce their wiring resistances. Due to the finer structure of the elements, however, simply expanding the power supply lines in width increases the layout size of the circuit in proportion to the dimensions of the lines. In other words, the width expansion creates wasted spaces having no elements arranged thereon, lowering the efficiency of the chip size reduction.

In a conventional contrivance to solve such a problem, the power supply lines are formed in a netlike configuration on the unused areas of wiring layers, to lower the wiring resistance and secure a predetermined amount of current.

Additionally, the amount of current supplied to the circuit can also be increased by raising the supply voltage to the circuit. The necessity of the circuit corresponding to a dedicated supply voltage, however, entails a plurality of power supply lines in different voltages within the chip, making each of the power supply lines smaller in wiring width. This may increase a drop in voltage, or cause a current density out of specifications.

Figure 1:
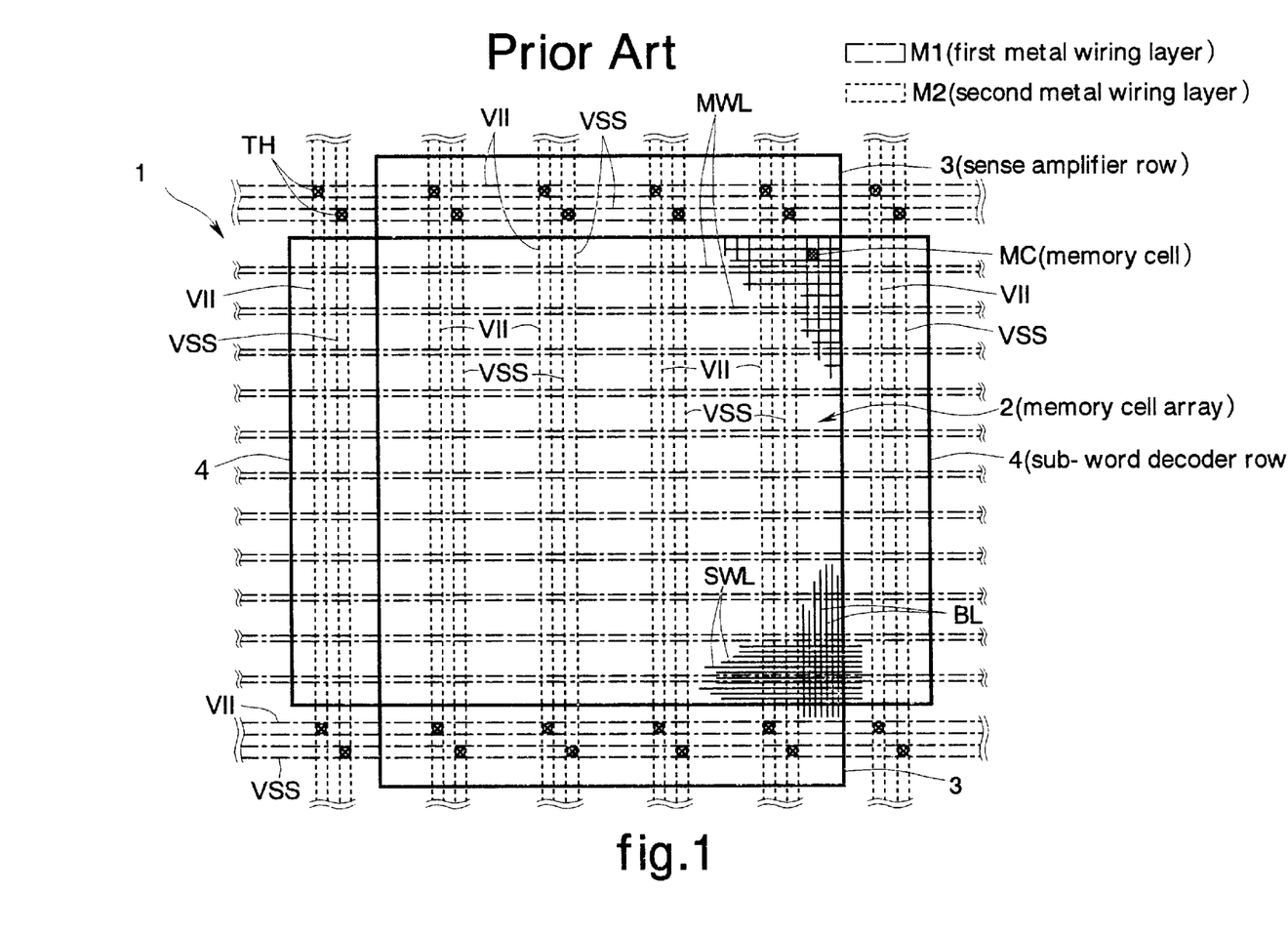
FIG. 1 is a layout diagram schematically showing a memory core unit of a conventional semiconductor integrated circuit.

FIG. 1 shows a part of a memory core unit of a DRAM which has power supply lines in a netlike configuration.

The semiconductor fabrication process for the DRAM provides wiring layers consisting of, in order from the side closer to the semiconductor substrate, a first polycide-wiring layer, a second polycide-wiring layer, a first metal wiring layer (the dot-dash lines in FIG. 1), and a second metal wiring layer (the broken lines in FIG. 1).

The memory core unit 1 has arranged a rectangular memory cell array 2. The memory cell array 2 comprises a plurality of memory cells MC arranged vertically and horizontally. Sense amplifier rows 3 each having a plurality of sense amplifiers and sub-word decoder rows 4 each having a plurality of sub-word decoders are arranged around the memory cell array 2 along the horizontal direction and the vertical directions, respectively.

In the memory cell array 2 and the sub-word decoder rows 4, a plurality of main-word lines MWL are formed along the horizontal direction using the first metal wiring layer. In each of the sense amplifier rows 3, an internal power supply line VII and a ground line VSS are formed along the horizontal direction using the first metal wiring layer. The internal power supply lines VII and the ground lines VSS are a kind of power supply line. In the sub-word decoder rows 4 and the memory cell array 2, internal power supply lines VII and ground lines VSS are formed along the vertical direction using the second metal wiring layer. The internal power supply lines VII formed of the first metal wiring layer are connected via through holes TH located outside the memory cell array 2 to the internal power supply lines VII formed of the second metal wiring layer. Similarly, the ground lines VSS formed of the first metal wiring layer are connected via through holes TH located outside the memory cell array 2 to the ground lines VSS formed of the second metal wiring layer. In this way, the internal power supply lines VII and the ground lines VSS are formed in a netlike configuration.

This DRAM has word lines of hierarchical structure, consisting of main-word lines MWL and sub-word lines SWL. The sub-word lines SWL are formed along the main-word lines MWL by using the first polycide-wiring layer, on the basis of four to each of the main-word line MWL. The sub-word lines SWL are wired from the sub-word decoder rows 4 to the memory cell array 2. The memory cell array 2 is also provided with a plurality of bit lines BL, which are formed at right angles to the main-word lines MWL by using the second polycide-wiring layer.

Incidentally, in a conventional 4-megabit DRAM or the like, all word lines used to be formed in parallel in a vertical configuration using both the first polycide-wiring layer and the first metal wiring layer. With increasing fineness of the elements, however, it has become difficult to form the word lines of the first metal wiring layer with the same spacing as that between the word lines of the first polycide-wiring layer. Specifically, it has become difficult to ensure wiring spacing which satisfies electromigration specifications. For this reason, the word lines have come to be hierarchically divided into the main-word lines MWL and the sub-word lines SWL as described above, so that only the sub-word lines SWL formed of the first polycide-wiring layer are formed on the memory cells.

Meantime, for further reduction in chip size, it has recently been practiced to reduce the number of sense amplifiers and connect more memory cells MC to each bit line BL, so as to reduce the size of the sense amplifier rows 3. Similarly, it has been practiced to reduce the number of sub-word decoders and connect more memory cells MC to each sub-word line SWL, so as to reduce the size of the sub-word decoder rows 4. The sub-word decoders and the sense amplifiers are circuits which are arranged on the chip with the number second largest to the memory cells MC. Accordingly, the reduction in the number of these circuits has a great effect on the reduction in chip size.

Reducing the sense amplifier rows 3 and the sub-word decoder rows 4 in size, however, tends to decrease the wiring widths of the power supply lines including the internal power supply lines VII and the ground lines VSS arranged over the memory core unit 1. This gives rise to a problem in that the internal power supply lines VII and the ground lines VSS in the netlike configuration shown in FIG. 1 cannot secure the required amount of current.

The amount of electric current on power supply lines can be secured by increasing the thickness of the metal wiring layers to lower the sheet resistance. Thicker metal wiring layers would, however, create higher steps in the chip's sectional direction, contributing to a decrease in yield.

A predetermined amount of current can also be secured by changing the structure of the metal wiring layers from being two-layered to three-layered. The structural change in the metal wiring layers, from being two-layered to three-layered, however, increases the number of processes in fabrication, raises the fabrication cost, and at the same time decreases yield.

SUMMARY OF THE INVENTION

The present invention has been achieved to solve such conventional problems, and an object thereof is to provide a semiconductor integrated circuit capable of supplying a sufficient amount of current to its power supply lines without an increase in fabrication cost.

According to one of the aspects of the semiconductor integrated circuit to the present invention, a memory cell array has a plurality of memory cells. A lower metal wiring layer has a plurality of first metal wirings, and a upper metal wiring layer has a plurality of second metal wirings, and they are respectively disposed over the memory cell arrays. At least one of the first metal wirings is used as a first power supply line. In other words, a power supply line is formed over the memory cell array which has arranged the plurality of memory cells using the lower metal wiring layer M1 which is disposed on the side closest to the memory cell array, of all the metal wiring layers. The power supply lines are formed over the memory cell array using not only the upper metal wiring layer M2 but the metal wiring layer M1 so that the wiring resistance of the power supply lines may decrease and a sufficient amount of current can be supplied to the power supply lines. Consequently, the circuits supplied with an electric current through the power supply lines become capable of high-speed operation. This is particularly effective for the high-speed operation of the circuits arranged around the memory cell array.

At least one of the second metal wirings is used as the first power supply line, and a contact hole connecting the first metal wiring as the first power supply line with the second metal wiring as the first power supply line are formed above the memory cell array. In other words, the power supply line formed using the lower metal wiring layer M1 is connected over the memory cell array to a power supply line which is formed using the metal wiring layer M2 on the upper layer than the metal wiring layer M1. Therefore, the netlike configuration of the power supply lines can be made with higher density compared to conventional ones.

At least one of the first metal wirings is used as a signal line, and one of the first metal wirings as the first power supply line is disposed between two of the first metal wirings as signal lines. In other words, a plurality of wires of another kind, compared to the power supply lines, are formed over the memory cell array using the metal wiring layer M1, same as that forming the power supply line. The power supply line is formed between the wires of another kind. The formation of the power supply line on an unused area between the wires of another kind makes it possible to acquire new power supply lines without increasing the chip size. As a result, a rise in fabrication cost is avoided.

A plurality of power supply lines is formed over the memory cell array using the metal wiring layer M1. This allows a further reduction in the wiring resistance of the power supply lines.

Neighboring two wirings of the first metal wirings as the signal lines extend in parallel, and the neighboring two wirings are arranged with a first gap in a first area and a second gap in a second area. Here, the second gap is larger than the first gap, and one of the first metal wirings as the first power supply lines is disposed in the second gap. In other words, the wires of another kind are formed with varying spaces between the wires over the memory cell array. The power supply lines are formed on the areas of wider space between the wires of another kind. The formation of power supply lines on the areas of wider space allows greater wiring width between the power supply lines and a further reduction in the wiring resistance. Besides, the formation creates sufficient spaces between the power supply lines and the wires of another kind so as to reduce the ratio of short failures occurring in the fabrication processes or the operation of the chip.

The nature, principle, and utility of the invention will become more apparent from the following detailed description when read in conjunction with the accompanying drawings in which like parts are designated by like reference numerals or characters.

DESCRIPTION OF THE PREFERRED EMBODIMENT

Hereinafter, a preferred embodiment of the present invention will be described with reference to the accompanying drawings.

Figure 2:
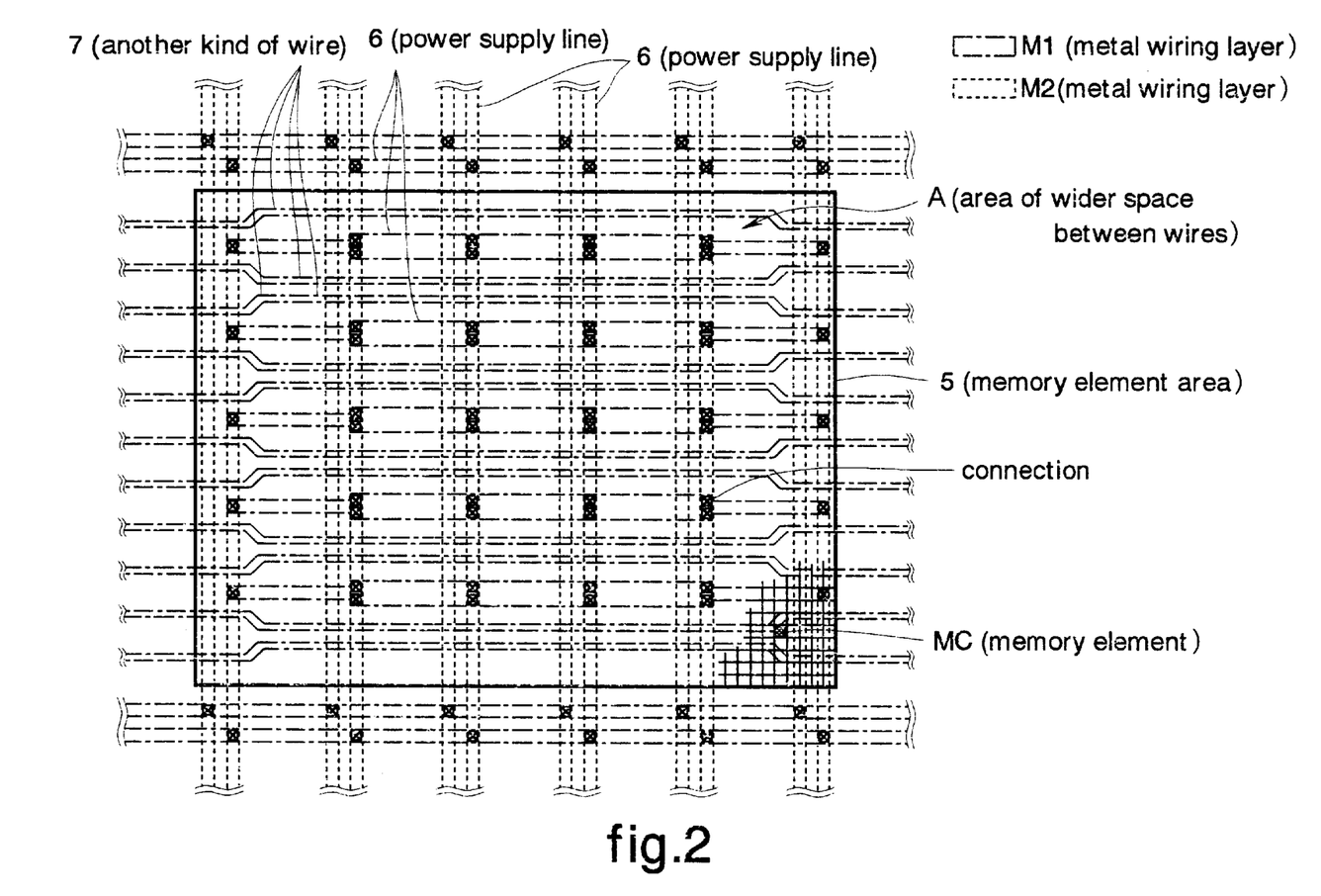
FIG. 2 is a block diagram showing the basic principle of an embodiment of the semiconductor integrated circuit according to the present invention.

FIG. 2 is a block diagram showing the basic principle of an embodiment of the semiconductor integrated circuit according to the present invention.

The semiconductor integrated circuit comprises a memory cell array having arranged a plurality of memory cells. Power supply lines 6 are formed over the memory cell array 5 using a metal wiring layer M1 which is disposed on the side closest to the array, of all the metal wiring layers. The power supply lines 6 formed using the metal wiring layer M1 are connected over the memory cell array 5 to power supply lines 6 which are formed using a metal wiring layer M2 on the upper layer than the metal wiring layer M1.

A plurality of wires 7 of another kind, compared to the power supply lines 6, are formed over the memory cell array 5 using the same metal wiring layer M1 as that of forming the power supply lines. Each of the power supply lines 6 is formed between the wires 7 of another kind. A plurality of the power supply lines 6 using the metal wiring layer M1 are formed over the memory cell array 5. The wires 7 of another kind are formed with varying wiring spaces between those adjacent to each other over the memory cell array 5. The power supply lines 6 are formed on the areas A of wider space between the wires 7 of another kind.

Figure 3:
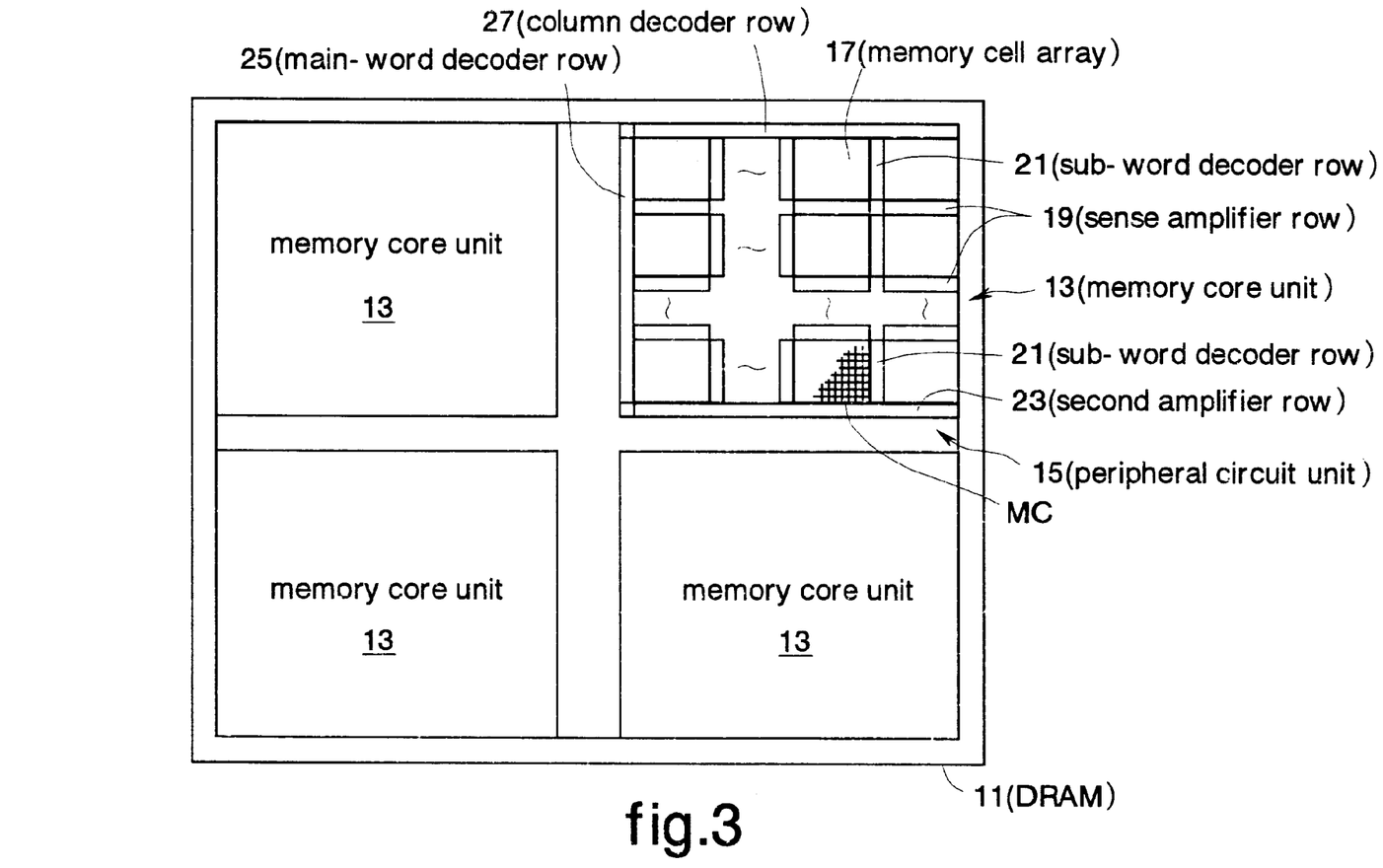
FIG. 3 is a diagram of the whole configuration of an embodiment of the semiconductor integrated circuit according to the present invention.

FIG. 3 shows the general configuration of the embodiment of the semiconductor integrated circuit according to the present invention.

The semiconductor integrated circuit in this embodiment is formed as a DRAM 11 on a silicon substrate. This DRAM 11 has been developed, for example, to reduce the chip size than a previous-generation DRAM with the same memory capacity as that of this DRAM 11. The semiconductor fabrication process adopted for the DRAM 11 provides, as described later, a first polycide-wiring layer P1, a second polycide-wiring layer P2, the first metal wiring layer M1, and the second metal wiring layer M2. Each of the first and second polycide-wiring layers P1 and P2 comprises two layers of polycrystal silicon over each of which is sputtered heat resistant metallic silicide. Each of the first and second metal wiring layers M1 and M2 comprises three layers, consisting of an AlSi alloy between upper and lower TiN layers. The first polycide-wiring layer P1 is a wiring layer for gate electrodes, being located the closest to the substrate. The second polycide-wiring layer P2 is arranged on the first polycide-wiring layer P1. The first and second metal wiring layers M1 and M2 are arranged in order on the second polycide-wiring layer P2. The metal wiring layers M1 and M2 are high in resistance as compared to the first and second polycide-wiring layers P1 and P2. On this account, the first and second metal wiring layers M1 and M2 are frequently used generally in wires for higher currents.

As shown in FIG. 3, the DRAM 11 has four memory core units 13. Formed among the memory core units 13 is a peripheral circuit unit 15 of cross shape. The peripheral circuit unit 15 has arranged not-shown pads, input/output buffers, control circuits, or the like.

The memory core units 13 have arranged a plurality of rectangular memory cell arrays 17. Each of the memory cell arrays 17 comprises a plurality of memory cells MC arranged vertically and horizontally. Above and below the memory cell arrays 17 are sense amplifier rows 19 arranged along the horizontal direction, each having a plurality of sense amplifiers. On the right and left of the memory cell arrays 17 are sub-word decoder rows 21 arranged along the vertical direction, each having a plurality of sub-word decoders.

On the lower (or upper) side of the memory core units 13, the side closer to the peripheral circuit unit 15, are second amplifier rows 23 arranged along the horizontal direction. Each of the second amplifier rows 23 has a plurality of second amplifiers for amplifying input/output data. On the left (or right) side of the memory core units 13, the side closer to the peripheral circuit unit 15, are main-word decoder rows 25 arranged along the vertical direction. Each of the main-word decoder rows 25 has a plurality of main-word decoders. On the upper (or lower) side of the memory core units 13, the side closer to the periphery of the chip, are column decoder rows 27 arranged along the horizontal direction. Each of the column decoder rows 27 has a plurality of column decoders.

Figure 4:
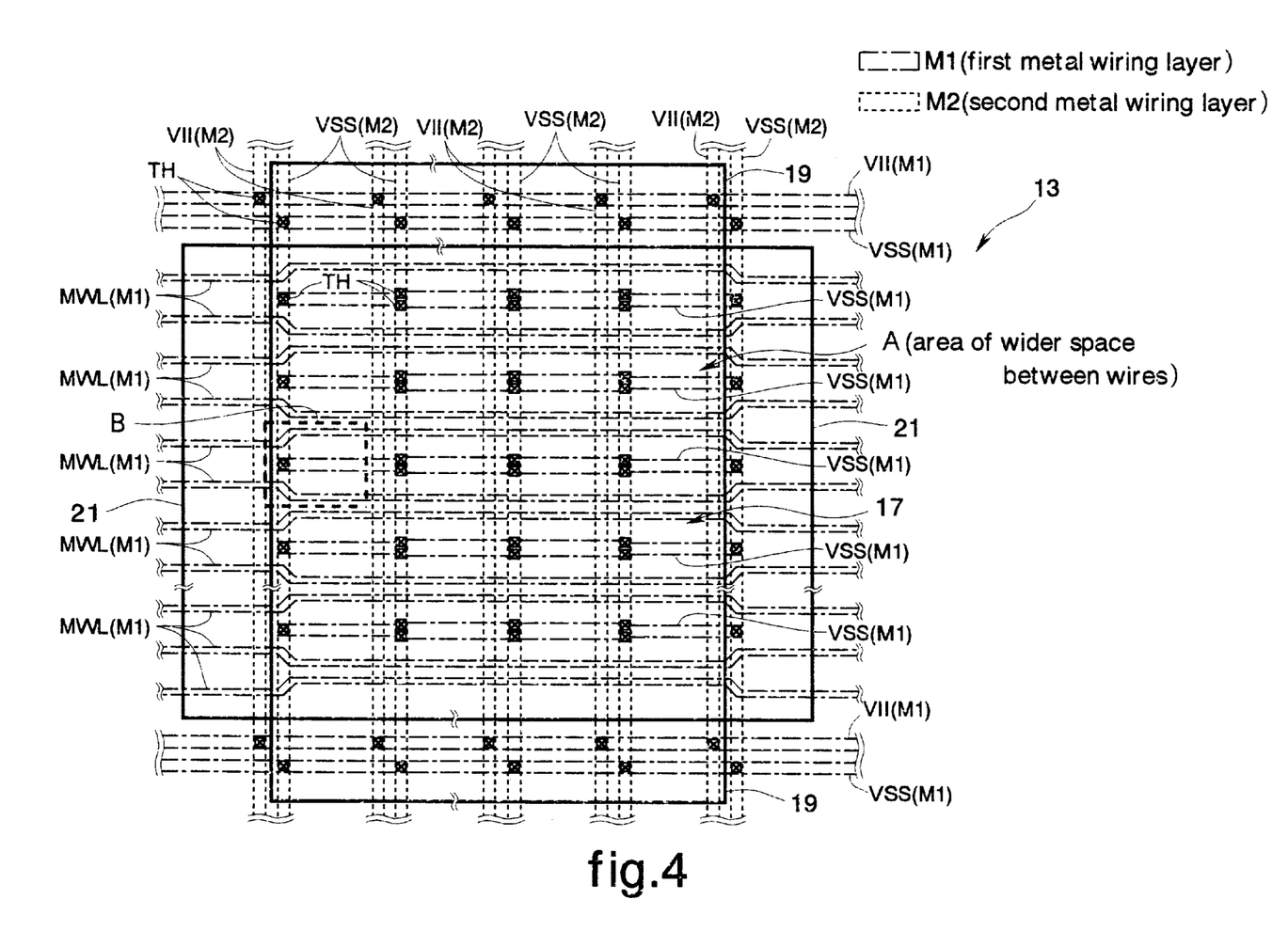
FIG. 4 is a layout diagram schematically showing a memory core unit of FIG. 3.

FIG. 4 schematically shows the wiring in a core memory unit 13 using the first and second metal wiring layers M1 and M2. In this embodiment, the first metal wiring layer M1 is used to form the wires along the horizontal direction in the diagram (the dot-and-dash lines). The second metal layer M2 is used to form the wires along the vertical direction in the diagram (the broken lines).

In the memory cell array 17 and the sub-word decoder rows 21, a plurality of main-word lines MWL are formed along the horizontal direction using the first metal wiring layer M1. The main-word lines MWL correspond to the wires of another kind stated in claim 3. Adjacent two of the main-word lines MWL are bent to draw apart from each other or approach each other at both sides of the memory cell array 17. This creates areas A of wider space between adjacent main-word lines MWL over the memory cell array 17.

Each of the areas A has a ground line VSS formed in parallel with the main-word lines MWL by using the first metal wiring layer M1. These ground lines VSS are formed to have a greater wiring width at the central portion of the memory cell array 17 wherein the spaces between the main-word lines MWL are wider.

In the sense amplifier rows 19, an internal power supply line VII and a ground line VSS are formed along the horizontal direction using the first metal wiring layer M1. The internal power supply lines VII and the ground lines VSS are a kind of power supply lines. In this embodiment, the internal power supply lines VII and the ground lines VSS arranged within the memory core units 13 are mainly used to supply power for driving the sense amplifiers.

In the memory cell array 17 and the sense amplifier rows 19, internal power supply lines VII and ground lines VSS are formed along the vertical direction using the second metal wiring layer M2. The ground lines VSS formed over the memory cell array 17 using the first metal wiring layer M1 are connected to the ground lines VSS formed of the second metal wiring layer M2, via through holes TH located within the memory cell array 17. The ground lines VSS formed of the first metal wiring layer M1 have the portions of greater wiring width being connected to the ground lines VSS formed of the second metal wiring layer M2 via pairs of through holes TH. The internal power supply lines VII formed across the sense amplifier rows 19 using the first metal wiring layer M1 are connected to the internal power supply lines VII formed of the second metal wiring layer M2, via through holes TH located outside the memory cell array 17. Similarly, the ground lines VSS formed across the sense amplifier rows 19 using the first metal wiring layer M1 are connected to the ground lines formed of the second metal wiring layer M2, via through holes TH located outside the memory cell array 17.

Thus, the internal power supply lines VII and the ground lines VSS are formed in a netlike configuration. In particular, the ground lines VSS are arranged in such a netlike configuration even within the memory cell arrays 17, so as to allow a further reduction in wiring resistance. In previous-generation DRAM before a chip-size reduction, for example, the bit lines BL (or /BL) varied in voltage to lower voltages more slowly than to higher voltages during the amplifying operation of sense amplifiers. The above netlike configuration is made to provide the solution to such a problem.

Figure 5:
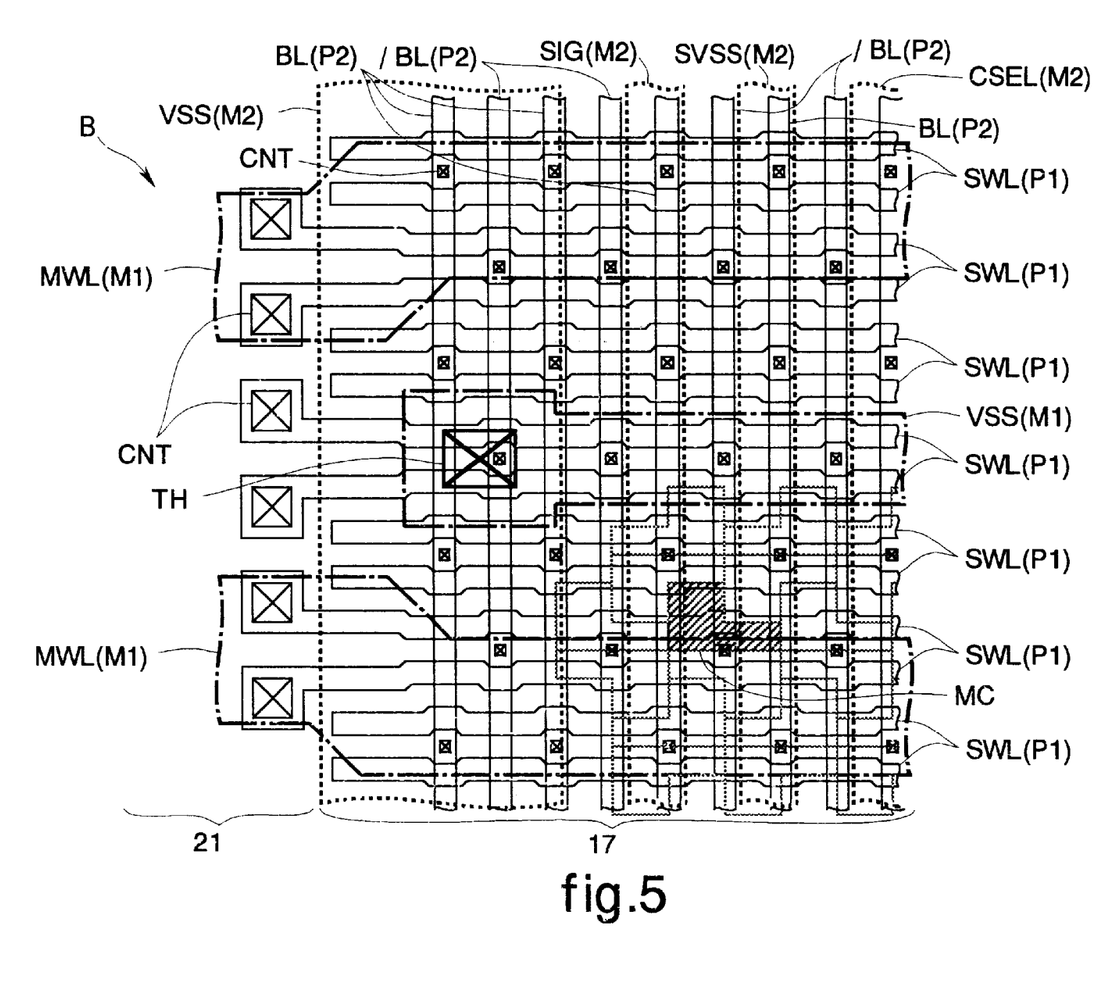
FIG. 5 is a layout diagram showing the details of the memory core array of FIG. 4.

FIG. 5 shows the details of the wiring layout in the region shown by the broken-line box B in FIG. 4.

In the DRAM 11 of this embodiment, word lines are hierarchically divided into the main-word lines MWL and sub-word lines SWL. The sub-word lines SWL are formed along the main-word lines MWL using the first polycide-wiring layer P1. The sub-word lines SWL, connected via contacts CNT to predetermined diffusion layers within the sub-word decoder row 21, are extended from the sub-word decoder row 21 to the memory cell array 17. In the diagram, those discontinued at the left end of the memory cell array 17 are sub-word lines SWL which are extended from another sub-word decoder row 21 on the right to the memory cell array 17. Four sub-word lines SWL are arranged with respected to each main-word line MWL.

In the memory cell array 17, a plurality of bit lines BL and /BL are formed orthogonal to the sub-word lines SWL by using the second polycide-wiring layer P2. The bit lines BL and /BL are complementary bit lines. For example, a bit line BL is used to read data from memory cells MC while the corresponding bit line /BL is used as the signal line to supply a reference voltage. The shaded area in the diagram corresponds to a single-bit memory cell MC.

In the memory cell array 17, signal lines SIG, shielding ground lines SVSS, column selecting lines CSEL, and the like are formed in parallel to the ground lines VSS using the second metal wiring layer M2 formed on the second metal wiring layer M2.

Incidentally, the chemical mechanical polishing technology or the like used therein tends to produce interlevel insulators of greater thickness. This prevents the through holes TH formed on the cells MC from lowering the reliability or the like of the memory cells MC.

In the semiconductor integrated circuit described above, a drive current is supplied through the ground lines VSS and the internal power supply lines VII of netlike configuration to sense amplifiers during data read and write operations from/to the memory cells MC. Here, the sense amplifiers are supplied with a sufficient amount of current due to the low wiring resistance of the ground lines VSS and the internal power supply lines VII. This reduces the voltage drop caused in the amplifying operations of the sense amplifiers, and ensures a predetermined voltage to the bit lines. In particular, the ground lines VSS which used to be problematic in previous-generation DRAM have the netlike configuration even over the memory cell arrays 17, thereby allowing a further reduction in wiring resistances. Accordingly, the sense amplifiers can perform their amplifying operations at a higher speed with a reduced access time.

In the semiconductor integrated circuit of above configuration, not only the upper, second metal wiring layer M2 but also the first metal wiring layer M1 is used to form the ground lines VSS over the memory cell arrays 17. As a result, the ground lines VSS that drive the sense amplifiers can be lowered in wiring resistance to reduce voltage drops. Accordingly, the sense amplifiers are capable of reliable and high-speed operations.

The ground lines VSS formed of the first metal wiring layer M1 are connected via the through holes TH located over the memory cell arrays 17 to the ground lines VSS which are formed using the second metal wiring layer M2 on the upper layer than the first metal wiring layer M1. Therefore, it is possible to form a netlike configuration of the ground lines VSS with higher density, compared to conventional ones, and to reduce wiring resistance.

The ground lines VSS of the first metal wiring layer M1 are formed between the main-word lines MWL which are formed over the memory cell arrays 17. This makes it possible to secure the new power supply lines with no increase in chip size, thereby avoiding a rise in fabrication cost.

The plurality of ground lines VSS are formed over the memory cell arrays 17 using the first metal wiring layer M1. This allows a further reduction in the wiring resistances of the ground lines VSS.

Any adjacent two of the main-word lines MWL are bent to draw apart from each other or approach each other so that the areas A of wider space between the main-word lines are formed over the memory cell arrays 17. On the areas A are formed the ground lines VSS using the first metal wiring layer M1. Accordingly, the ground lines VSS can be made with a greater wiring width, further reducing the wiring resistances. Besides, the spare wiring spacing between the ground lines VSS and the main-word lines MWL allows a reduction in the ratio of short failures occurring in the fabrication process or in the operation of the chip.

The above embodiment has been described in conjunction with the example where the semiconductor integrated circuit of the present invention is formed as a DRAM 11 over a silicon substrate. However, the present invention is not limited to such embodiments. For example, the present invention may be applied to a memory array in a DRAM implemented in a system LSI.

The above embodiment has been described in conjunction with the example where the first metal wiring layer M1 is used to form ground lines VSS within the memory cell arrays 17. However, the present invention is not limited to such embodiments. For example, there may be formed internal power supply lines VII and other power supply lines (boosted power supply lines or the like) as well.

The above embodiment has been described in conjunction with the example where any adjacent two of the main-word lines MWL are bent to draw apart from each other or approach each other to form the areas A of wider space between the main-word lines MWL over the memory cell arrays 17. However, the present invention is not limited to such embodiments. For example, adjoining three or more of the main-word lines MWL may be bend to form areas A of yet wider space. In this case, ground lines VSS of yet greater wiring width can be formed on the areas A.

The above embodiment has been described in conjunction with the example where the ground lines VSS are formed between the main-word lines MWL. However, the present invention is not limited to such embodiments. For example, when wires other than the main-word lines MWL are formed using the first metal wiring layer M1, the ground lines VSS may be formed between these wires.

The above embodiment has been described in conjunction with the example where the first and second metal wiring layers M1 and M2 have a three-layered configuration consisting of an AlSi alloy between upper and lower TiN layers. However, the present invention is not limited to such embodiments. For example, the first and second metal wiring layers M1 and M2 may comprise a W alloy. In this case, even those W alloys of higher resistance, compared to AlSi alloys, allow a reduction in wiring resistance to the extent that satisfies a predetermined current density.

The invention is not limited to the above embodiments and various modifications are possible without departing from the spirit and scope of the invention. Any improvements may be made in part or all of the components.

What is claimed is:

1. A semiconductor integrated circuit comprising:

a memory cell array having a plurality of memory cells;

a lower metal wiring layer having a plurality of first metal wirings disposed over the memory cell array; and an upper metal wiring layer having a plurality of second metal wirings disposed over the memory cell array, wherein at least one of said first metal wirings disposed over the memory cell array is used as a first power supply line.

2. The semiconductor integrated circuit according to claim 1, wherein at least one of said second metal wirings is used as said first power supply line, and wherein a contact hole connecting said first metal wiring as the first power supply line with said second metal wiring as the first power supply line is formed above the memory cell array.

3. The semiconductor integrated circuit according to claim 2, wherein said first metal wirings extend in a first direction and said second metal wirings extend in a second direction which is perpendicular to said first direction.

4. The semiconductor integrated circuit according to claim 1, wherein at least one of said first metal wirings is used as a signal line, and one of said first metal wirings as the first power supply line is disposed between two of said first metal wirings as signal lines.

5. The semiconductor integrated circuit according to claim 4, wherein said signal line is a word line coupled to said memory cell.

6. The semiconductor integrated circuit according to claim 2, wherein at least one of said second metal wirings is used as a second power supply line.

7. The semiconductor integrated circuit according to claim 4, wherein neighboring two wirings of said first metal wirings as the signal lines extend in parallel, and said neighboring two wirings are arranged with a first gap in a first area and are arranged with a second gap, which is larger than said first gap, in a second area, and wherein one of said first metal wirings as the first power supply lines is disposed in said second gap.

* * * * *